(12) United States Patent
Chen et al.

(10) Patent No.: US 12,308,309 B2
(45) Date of Patent: May 20, 2025

(54) SEMICONDUCTOR DEVICE WITH INTEGRATED METAL-INSULATOR-METAL CAPACITORS

(71) Applicant: Taiwan Semiconductor Manufacturing Co., Ltd., Hsinchu (TW)

(72) Inventors: Wei-Zhong Chen, Taipei (TW); JeiMing Chen, Tainan (TW); Tze-Liang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 507 days.

(21) Appl. No.: 17/674,459

(22) Filed: Feb. 17, 2022

(65) Prior Publication Data
US 2023/0154843 A1 May 18, 2023

Related U.S. Application Data

(60) Provisional application No. 63/264,202, filed on Nov. 17, 2021.

(51) Int. Cl.
*H01L 23/522* (2006.01)
*H01L 21/768* (2006.01)
(Continued)

(52) U.S. Cl.
CPC .... *H01L 23/5223* (2013.01); *H01L 21/76829* (2013.01); *H01L 21/76877* (2013.01);
(Continued)

(58) Field of Classification Search
CPC ............ H01L 23/5223; H01L 23/5226; H01L 23/528; H01L 21/76829; H01L 21/76877;
(Continued)

(56) References Cited

U.S. PATENT DOCUMENTS 5,990,556 A * 11/1999 Mizobuchi ............. C23C 16/06
257/E21.162
6,710,425 B2 * 3/2004 Bothra .................... H01L 28/40
257/532

(Continued)

*Primary Examiner* — Marcos D. Pizarro
*Assistant Examiner* — Tiberiu Dan Onuta
(74) *Attorney, Agent, or Firm* — Slater Matsil, LLP

(57) ABSTRACT

A semiconductor device includes: a substrate; an interconnect structure over the substrate; an etch stop layer over the interconnect structure; and metal-insulator-metal (MIM) capacitors over the etch stop layer. The MIM capacitors includes: a bottom electrode extending along the etch stop layer, where the bottom electrode has a layered structure that includes a first conductive layer, a second conductive layer, and a third conductive layer between the first conductive layer and the second conductive layer, where the first conductive layer and the second conductive layer include a first material, and the third conductive layer includes a second material different from the first material; a first dielectric layer over the bottom electrode; a middle electrode over the first dielectric layer, where the middle electrode has the layered structure; a second dielectric layer over the middle electrode; and a top electrode over the second dielectric layer.

20 Claims, 17 Drawing Sheets

(51) Int. Cl.
   *H10D 1/00* (2025.01)
   *H10D 1/68* (2025.01)

(52) U.S. Cl.
   CPC ......... *H01L 23/5226* (2013.01); *H10D 1/042* (2025.01); *H10D 1/043* (2025.01); *H10D 1/716* (2025.01)

(58) Field of Classification Search
   CPC ... H01L 21/76895; H01L 28/91; H01L 28/92; H01L 28/60; H01L 28/90; H10B 12/033
   See application file for complete search history.

(56) References Cited

U.S. PATENT DOCUMENTS

| | | | |
|---|---|---|---|
| 8,279,008 B2 | 10/2012 | Hsieh et al. | |
| 8,427,240 B2 | 4/2013 | Hsieh et al. | |
| 8,593,206 B2 | 11/2013 | Chen et al. | |
| 8,610,494 B1 | 12/2013 | Jin et al. | |
| 8,618,631 B2 | 12/2013 | Jin et al. | |
| 8,680,599 B2 * | 3/2014 | Mitsuyama | H01L 21/76883 |
| | | | 257/532 |
| 10,290,701 B1 * | 5/2019 | Chang | H01L 23/5223 |
| 2006/0115954 A1 * | 6/2006 | Shim | H10B 12/318 |
| | | | 257/E21.648 |
| 2012/0092230 A1 | 4/2012 | Hung et al. | |
| 2013/0234305 A1 | 9/2013 | Lin et al. | |
| 2014/0132333 A1 | 5/2014 | Jin et al. | |
| 2014/0217546 A1 | 8/2014 | Yen et al. | |
| 2014/0253262 A1 | 9/2014 | Isieh et al. | |
| 2014/0253391 A1 | 9/2014 | Yen | |
| 2014/0264748 A1 * | 9/2014 | Fujiwara | H01L 28/40 |
| | | | 257/532 |
| 2017/0092649 A1 * | 3/2017 | Takaoka | H01L 28/00 |
| 2020/0035779 A1 | 1/2020 | Huang et al. | |

\* cited by examiner

SEMICONDUCTOR DEVICE WITH INTEGRATED METAL-INSULATOR-METAL CAPACITORS

PRIORITY CLAIM AND CROSS-REFERENCE

This application claims the benefit of U.S. Provisional Application No. 63/264,202, filed on Nov. 17, 2021 and entitled "Pattern TiN Electrode Surface Roughness Improvement by Thin Ti Layer Insertion," which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
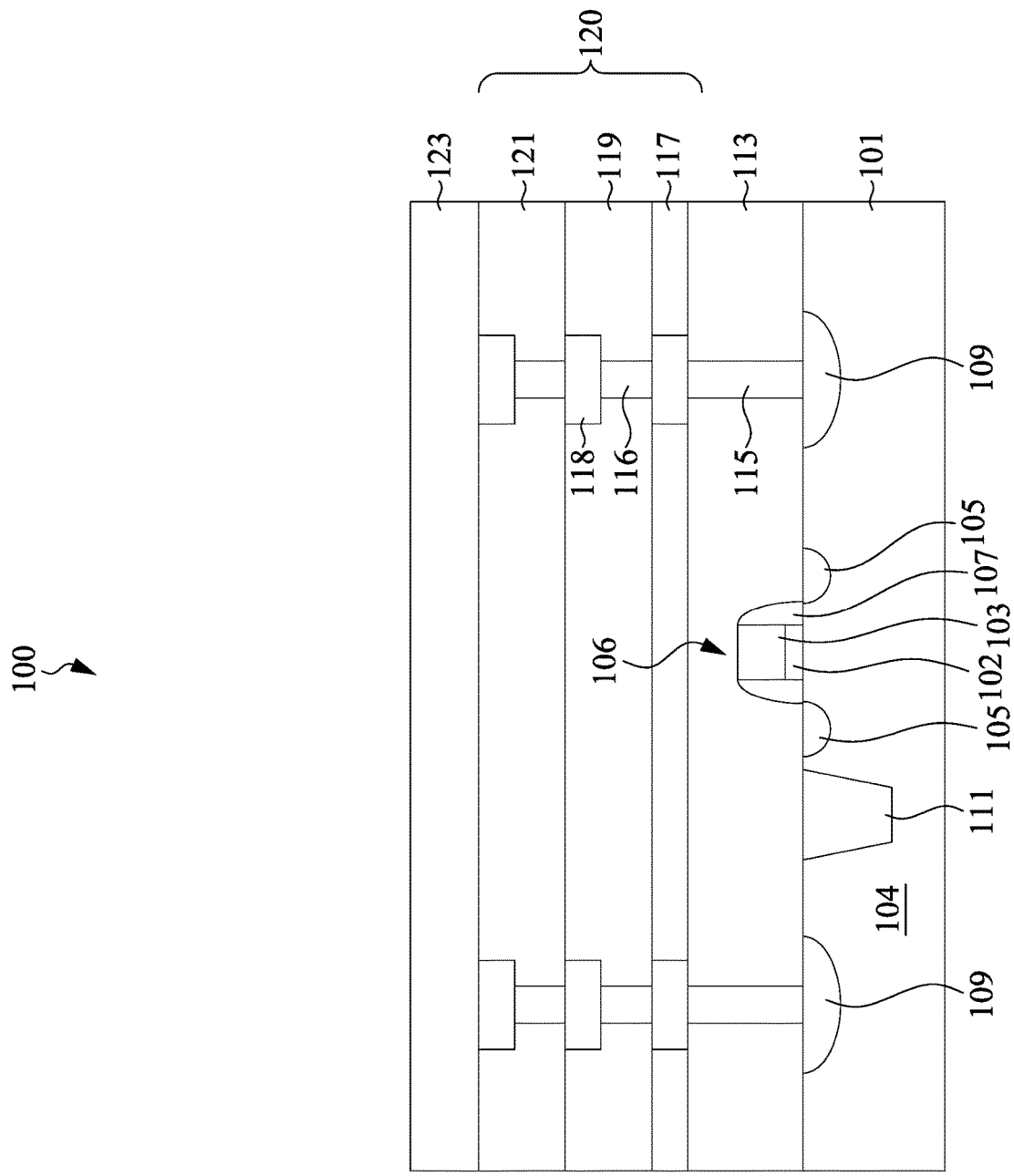
FIGS. 1-14 illustrate cross-sectional views of a semiconductor device at various stages of manufacturing, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar element formed by a same or similar process using a same or similar material(s).

In accordance with some embodiments, metal-insulator-metal (MIM) capacitors are formed in the back end of line processing (BEOL) of a semiconductor die. The MIM capacitors are formed by successively forming a bottom electrode, a first high-k dielectric layer, a middle electrode, a second high-k dielectric layer, and a top electrode over an interconnect structure of the semiconductor die. At least the bottom electrode and the middle electrode are formed as having a tri-layered structure, where the tri-layered structure includes a first conductive layer, a second conductive, and a third conductive layer sandwiched in-between. The first conductive layer and the second conductive layer are formed of a first material, and the third conductive layer is formed of a second material different from the first material. In some embodiments, the third conductive layer breaks the columnar crystalline structure of the first material and reduces the surface roughness of at least the bottom electrode and the middle electrode. The reduced surface roughness alleviates or avoids performance degradation due to high surface roughness.

FIGS. 1-14 illustrate cross-sectional views of a semiconductor device 100 at various stages of manufacturing, in an embodiment. The semiconductor device 100 is an integrated circuit (IC) device (also referred to as an IC die) with integrated metal-insulator-metal (MIM) capacitors formed during back end of line (BEOL) processing. As illustrated in FIG. 1, the semiconductor device 100 includes a substrate 101, transistors 106 formed in or on the substrate 101, an interlayer dielectric (ILD) 113, an interconnect structure 120, and an etch stop layer 123.

The substrate 101 may be a semiconductor substrate, such as a bulk semiconductor, a semiconductor-on-insulator (SOI) substrate, or the like, which may be doped (e.g., with a p-type or an n-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Transistors 106 are formed in/on the substrate 101 in an active region 104 of the substrate 101. The active region 104 may be, e.g., a fin that protrudes above the substrate 101. The fin may be formed of a semiconductor material (e.g., Si, or SiGe), and may be formed by, e.g., etching trenches in the substrate 101. The transistors 106 may be formed using any suitable method(s) known and used in the art. Each of the transistors 106 may be, e.g., a fin field-effect transistor (FinFET), and may include source/drain regions 105, a gate dielectric 102, a gate electrode 103, and gate spacers 107. Insulation regions 111, such as shallow trench isolation (STI) regions, are formed in the substrate 101 adjacent to the transistors 106. Note that FinFET is used as a non-limiting example. The transistors 106 may be other types of transistors, such as planar transistors. Besides transistors 106, other electrical components, such as resistors, inductors, diodes, or the like, may also be formed in/on the substrate 101. FIG. 1 further illustrates conductive regions 109, which are used to illustrate any conductive features formed in/on the substrate 101. For example, each of the conductive regions 109 may be a terminal (e.g., the source/drain region 105, or the gate electrode 103) of a transistor 106, a terminal of a resistor, a terminal of an inductor, a terminal of a diode, or the like. Note that throughout the description herein, unless otherwise specified, the term "conductive feature," "conductive region," or "conductive material" refer to electrically conductive feature, electrically conductive region, or electrically conductive material, and the terms "couple" or "coupled" refers to electrical coupling.

Still referring to FIG. 1, after the electrical components (e.g., transistors 106) are formed in/on the substrate 101, the ILD 113 is formed over the substrate 101 around the gate structures (e.g., 102/103) of the transistors 106. The ILD 113 may be formed of a dielectric material, and may be deposited by any suitable method, such as chemical vapor deposition (CVD), plasma-enhanced CVD (PECVD), or flowable CVD (FCVD). Suitable dielectric materials for the ILD 113 include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may also be used.

Next, contact plugs 115 are formed in the ILD 113 to be coupled with the conductive regions 109. Contact plugs 115 may be formed by etching openings in the ILD 113 using photolithography and etching techniques, then filling the openings with one or more conductive materials. For example, after the openings in the ILD 113 are formed, a barrier layer comprising an electrically conductive material, such as titanium nitride, tantalum nitride, titanium, tantalum, or the like, may be conformally formed to line the sidewalls and bottoms of the openings. The barrier layer may be formed using a CVD process, such as plasma-enhanced CVD (PECVD). However, other alternative processes, such as sputtering or metal organic chemical vapor deposition (MOCVD), atomic layer deposition (ALD), may alternatively be used. After the barrier layer is formed, a conductive material, such as copper, tungsten, gold, cobalt, combinations thereof, or the like, may be formed to fill the openings to form the contact plugs 115. A planarization process, such as chemical mechanical planarization (CMP), may be performed to remove excess portions of the barrier layer and the conductive material from the upper surface of the ILD 113.

Next, the interconnect structure 120 is formed to interconnect the electrical components formed in/on the substrate 101 to form functional circuits. The interconnect structure 120 includes a plurality of dielectric layers (e.g., 117, 119, 121) and conductive features (e.g., vias 116 and conductive lines 118) formed in the dielectric layers. The dielectric layers 117, 119, and 121 may be made of one or more suitable dielectric materials such as silicon oxide, silicon nitride, low-k dielectric material such as carbon doped oxide, extremely low-k dielectrics such as porous carbon doped silicon dioxide, combinations thereof, or the like. The dielectric layers 117, 119, and 121 may be formed through a suitable process such as CVD, although any suitable process may be utilized. The conductive features (e.g., vias 116 and conductive lines 118) of the interconnect structure 120 may be formed using a suitable method, such as damascene, dual-damascene, or the like. The number of dielectric layers in the interconnect structure 120 and the electrical connection illustrated in FIG. 1 are merely non-limiting examples, as skilled artisans readily appreciate. Other numbers of dielectric layers and other electrical connection are possible and are fully intended to be included within the scope of the present disclosure.

Next, in FIG. 1, the etch stop layer (ESL) 123 is formed over the interconnect structure 120. The ESL 123 is formed of a material having a different etch rate than a subsequently formed conductive layer 125A (see FIG. 2). In an embodiment, the ESL 123 is formed of silicon oxide using PECVD, although other dielectric materials such as nitride, silicon oxynitride, combinations thereof, or the like, and alternative techniques of forming the ESL 123, such as low-pressure CVD (LPCVD), physical vapor deposition (PVD), or the like, could be used.

Figure 2:
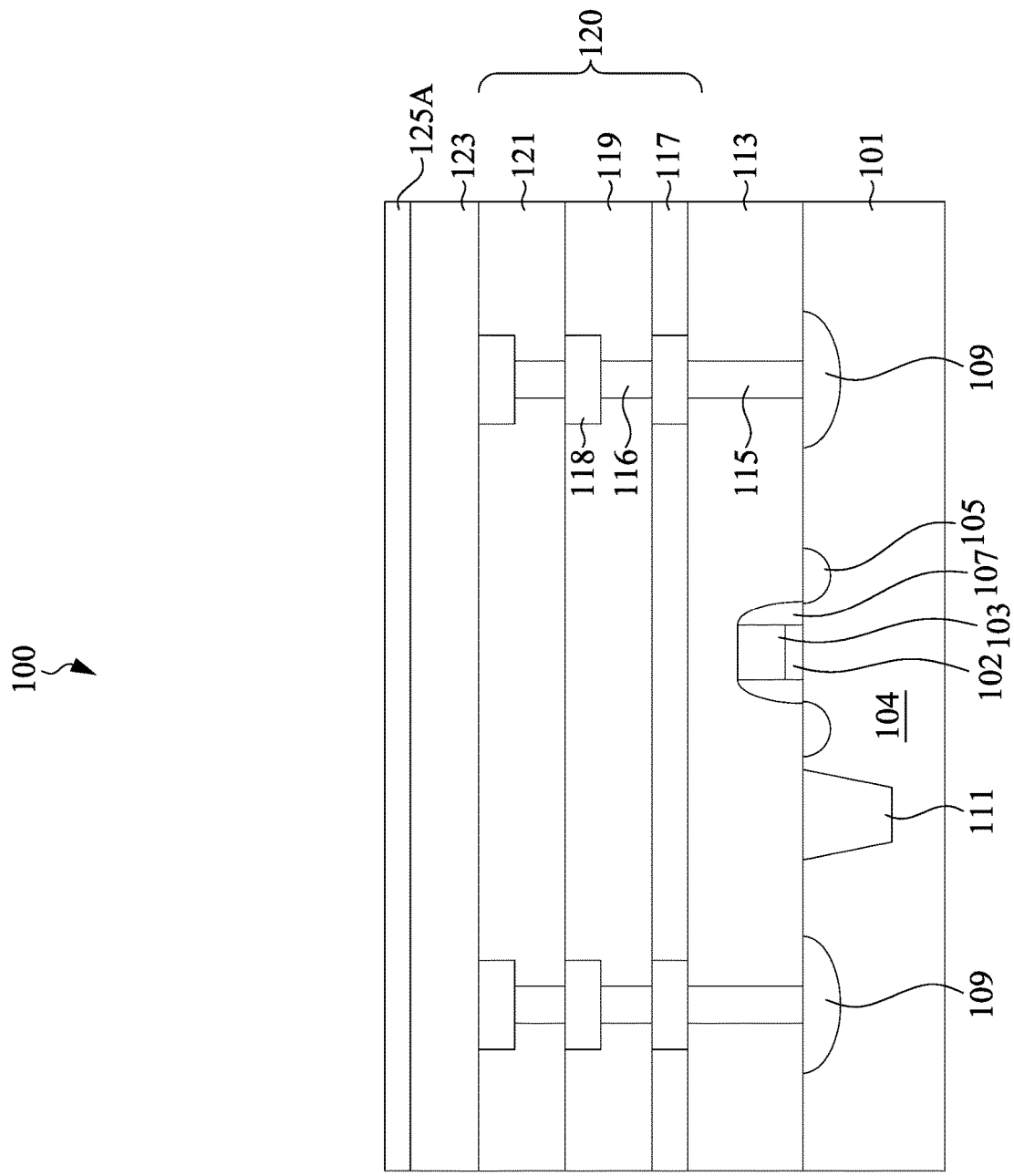

Referring next to FIG. 2, a conductive layer 125A is formed over the ESL 123. The conductive layer 125A is formed of a conductive material, such as titanium nitride (TiN), tantalum nitride (TaN), tungsten (W), tungsten silicide (WSi), platinum (Pt), aluminum (Al), copper (Cu), or the like, and may be formed by a suitable method such as PVD, CVD, ALD, or the like. In an example embodiment, the conductive layer 125A is formed of TiN using PVD. A thickness of the conductive layer 125A is between about 100 angstroms and about 1000 angstroms, in some embodiments. A thickness of the conductive layer 125A smaller than 100 angstroms may be too thin to form the bottom electrode for the subsequently formed MIM capacitor, and a thickness of the conductive layer 125A larger than 1000 angstroms may be too thick to pattern in the subsequent patterning process. A deposition power of the PVD process, which is the power of the DC source (or DC source and RF source in case of a dual-power source PVD process) used in the PVD process, is between about 1 KW and about 30 KW, in some embodiments. A deposition power smaller than 1 KW may not be enough to ignite the sputter gas into plasma and/or may result in too slow of a deposition rate, and a deposition power larger than 30 KW may cause the deposition rate of the conductive layer 125A to be too high to be able to control precisely.

Figure 3:
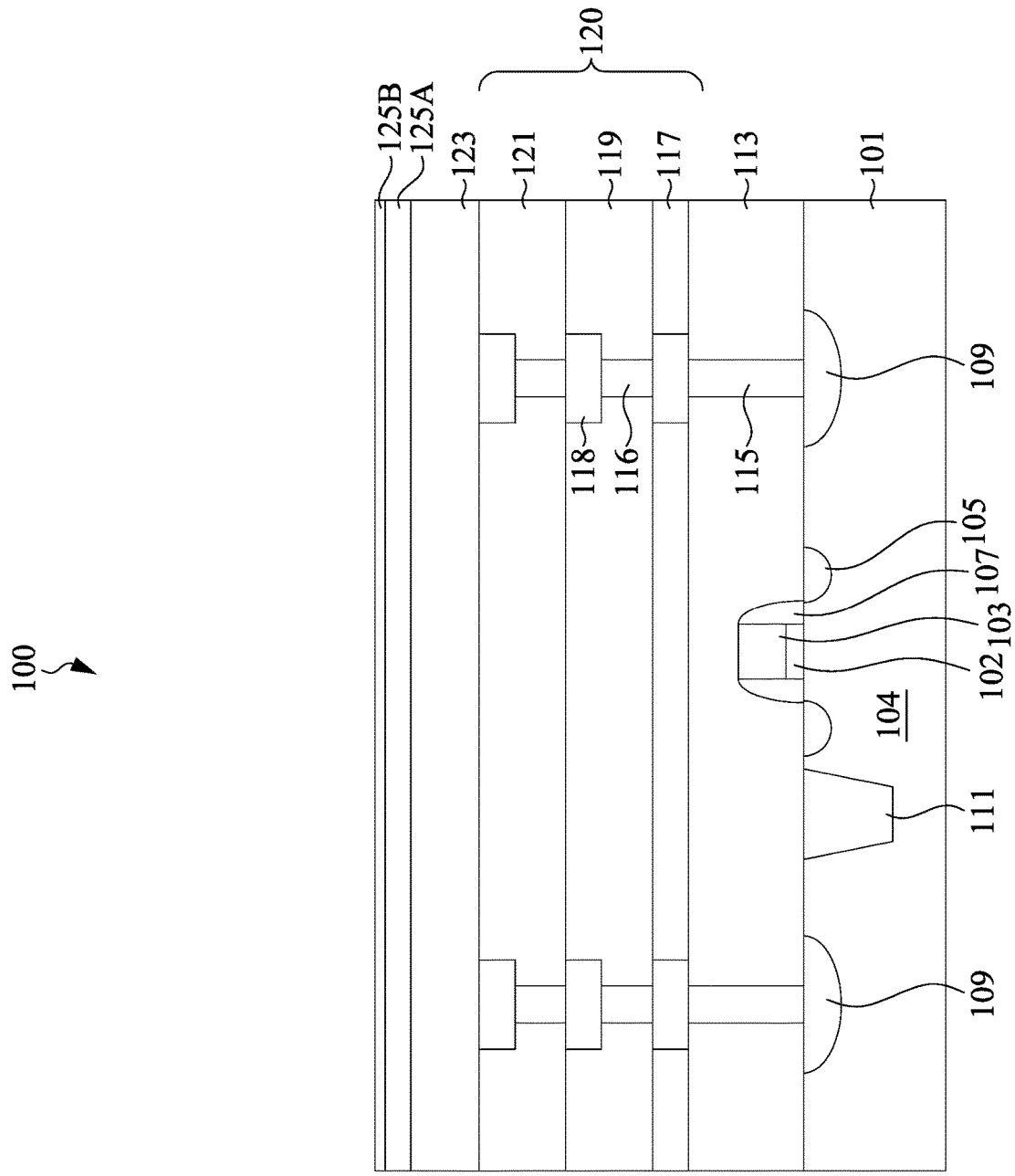

Next, in FIG. 3, a conductive layer 125B is formed over the conductive layer 125A. The conductive layer 125B is formed of a different conductive material than the conductive layer 125A. Example materials for the conductive layer 125B include titanium (Ti), tantalum (Ta), tungsten (W), and the like. The conductive layer 125B may have a thickness between about 5 angstroms and about 10 angstroms. A suitable deposition method, such as PVD, ALD, or the like, may be used to form the conductive layer 125B. In an example embodiment, the conductive layer 125A is formed of TiN, and the conductive layer 125B is formed of Ti, in which case the conductive layer 125B and the conductive layer 125A may advantageously be formed in a same deposition chamber for PVD deposition.

Figure 4:
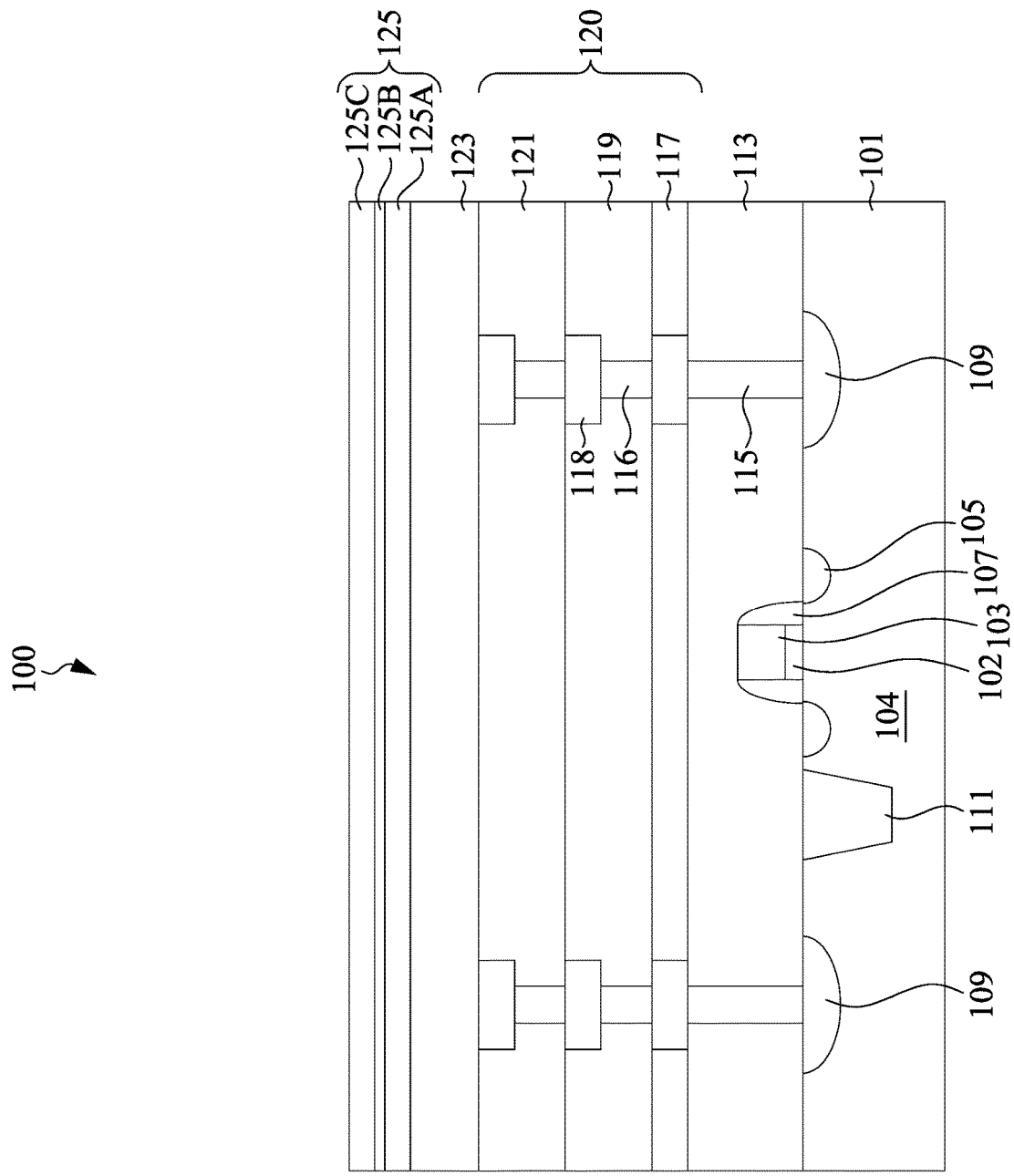

Next, in FIG. 4, a conductive layer 125C is formed over the conductive layer 125B. In the illustrated embodiment, the conductive layer 125C is formed of the same conductive material as the conductive layer 125A using a same formation method, thus details are not repeated. A thickness of the conductive layer 125C is between about 100 angstroms and about 1000 angstroms, in some embodiments. In some embodiments, a PVD process is performed to form the conductive layer 125C, and a deposition power of the PVD process is between about 1 KW and about 30 KW.

The conductive layers 125A, 125B, and 125C form a tri-layered structure 125 (also referred to as a multi-layered structure 125). In an example embodiment, the conductive layers 125A and 125B are formed of TiN, the conductive layer 125B is formed of Ti, and the combination of materials for the tri-layered structure 125 may be denoted as TiN/Ti/TiN. Other example combinations of materials for the multi-layered structure 125 include TaN/Ta/TaN, TaN/Ti/TaN, and WSi/W/WSi, where the first, the second, and the third materials listed correspond to the conductive layers 125A, 125B, and 125C, respectively.

The tri-layered structure 125, with the conductive layer 125B being sandwiched between the conductive layers 125A and 125C, advantageously reduces the surface roughness of the conductive layers 125A and 125C. For example, the surface roughness (e.g., of the upper surface) of the conductive layer 125C is reduced, compared with a reference design where the tri-layered structure 125 is replaced with a thick, single conductive layer formed of the conductive material of the conductive layer 125A (or 125C). In some embodiments, thin films such as the conductive layer 125A formed by PVD process in the back end of line (BEOL) process domain (e.g., at temperature less than 400° C.) have a columnar polycrystalline structure. Thin films with columnar polycrystalline structure, if grown to large thicknesses (e.g., above a few hundred angstroms), may have high surface roughness due to the large differences in the heights of the grains in the columnar polycrystalline structure. For example, the RMS surface roughness for the reference design (e.g., a single conductive layer with a thickness of about 600 angstroms) may be between about 1.8 nm and 2.0 nm. The conductive layer 125B in the tri-layered structure 125 breaks the columnar polycrystalline structure of the material (e.g., TiN) of the conductive layers 125A (and 125C), which results in smaller grains and smaller height differences. As a result, the surface roughness of the conductive layer 125C and 125A is reduced. For example, the RMS roughness for the conductive layer 125C may be between about 1.6 nm and about 1.8 nm. In some embodiments, the conductive layer 125B is referred to as an insertion layer, and the tri-layered structure 125 is described as a columnar polycrystalline material (e.g., the material of the conductive layer 125A or 125C) with an embedded insertion layer 125B. In some embodiments, unlike the conductive layers 125A and 125C (which are formed of a material having a columnar polycrystalline structure), the conductive layer 125B is formed of a material having a much smoother flat grain structure. In some embodiments, the conductive layer 125B is formed of a material having a structure between a flat grain structure and a columnar polycrystalline structure, but due to its small thickness (e.g., less than 10 angstroms), the conductive layer 125B does not exhibit behavior of a columnar polycrystalline structure.

The tri-layered structure 125 is patterned in subsequent processing to form the bottom electrode of an MIM capacitor. In the MIM capacitor, electrode surfaces with high surface roughness may cause corona effect (e.g., high local electrical field), which may negatively affect the performance of the MIM capacitor in terms of breakdown voltage (VBD) and time-dependent dielectric breakdown (TDDB) for the dielectric layer (see, e.g., 127 in FIG. 7) in the MIM capacitor. In addition, high surface roughness may result in a weak interface between the electrode and the subsequently formed dielectric layer (e.g., 127), resulting in, e.g., delamination of the dielectric layer 127. The disclosed tri-layered structure 125, by breaking the columnar polycrystalline structure of the conductive layers 125A and 125C, reduces the surface roughness, thereby alleviating or avoiding the performance issues discussed above.

Figure 5:
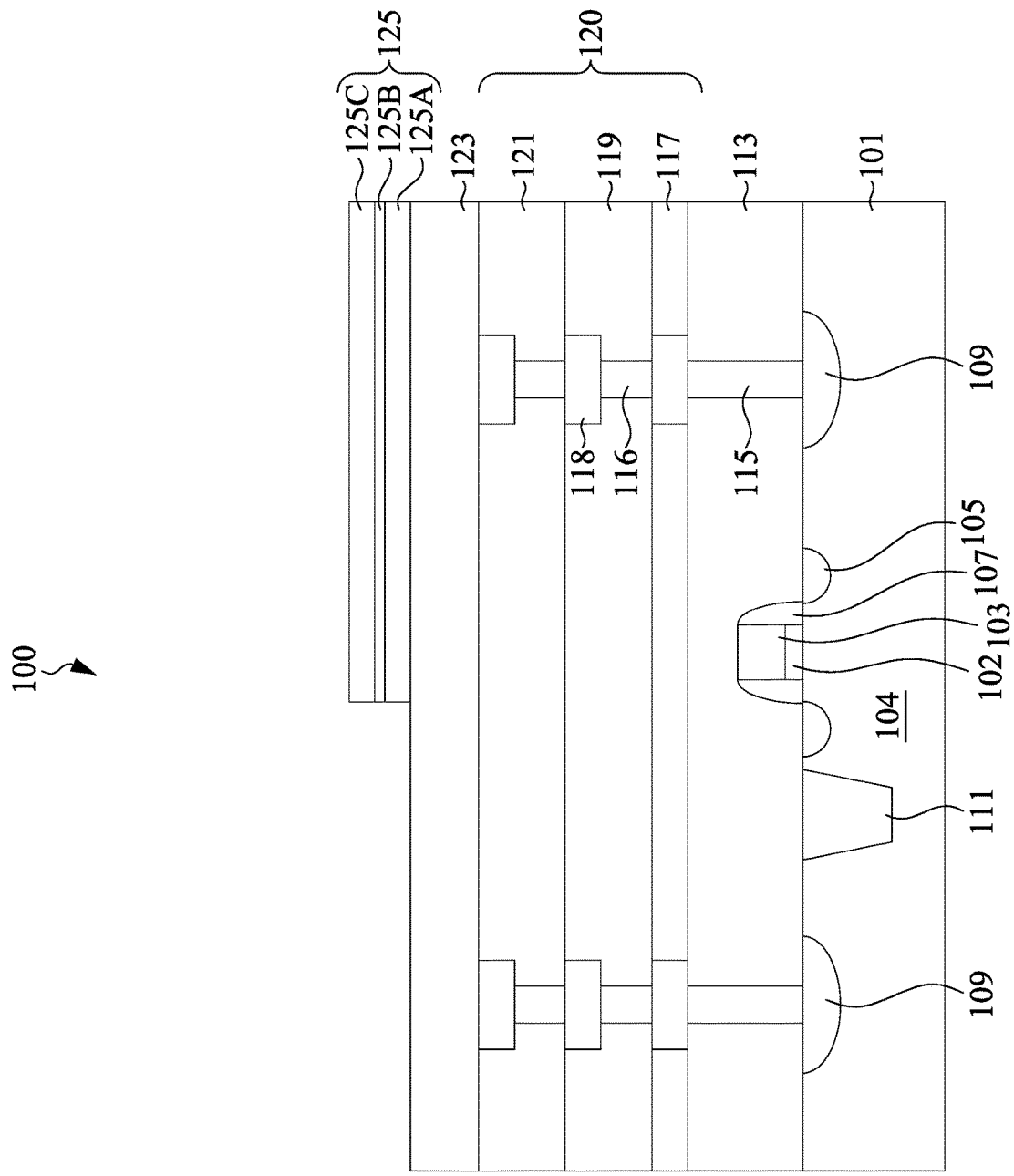

Next, in FIG. 5, the tri-layered structure 125 is patterned to form a bottom electrode 125. In some embodiments, a photoresist layer is formed on the tri-layered structure 125. The photoresist layer is patterned using, e.g., photolithography. An anisotropic etching process is then performed using the patterned photoresist layer as the etching mask. The anisotropic etching process may use an etchant that is selective to (e.g., having a higher etching rate for) the material of the photoresist layer. After the anisotropic etching process, the remaining portion of the tri-layered structure 125 forms the bottom electrode 125. As illustrated in FIG. 5, the bottom electrode 125 covers a first portion (e.g., right portion in FIG. 5) of the ESL 123 and exposes a second portion (e.g., left portion in FIG. 5) of the ESL 123. After the bottom electrode 125 is formed, the patterned photoresist layer is removed by a suitable process, such as ashing.

Figure 6:
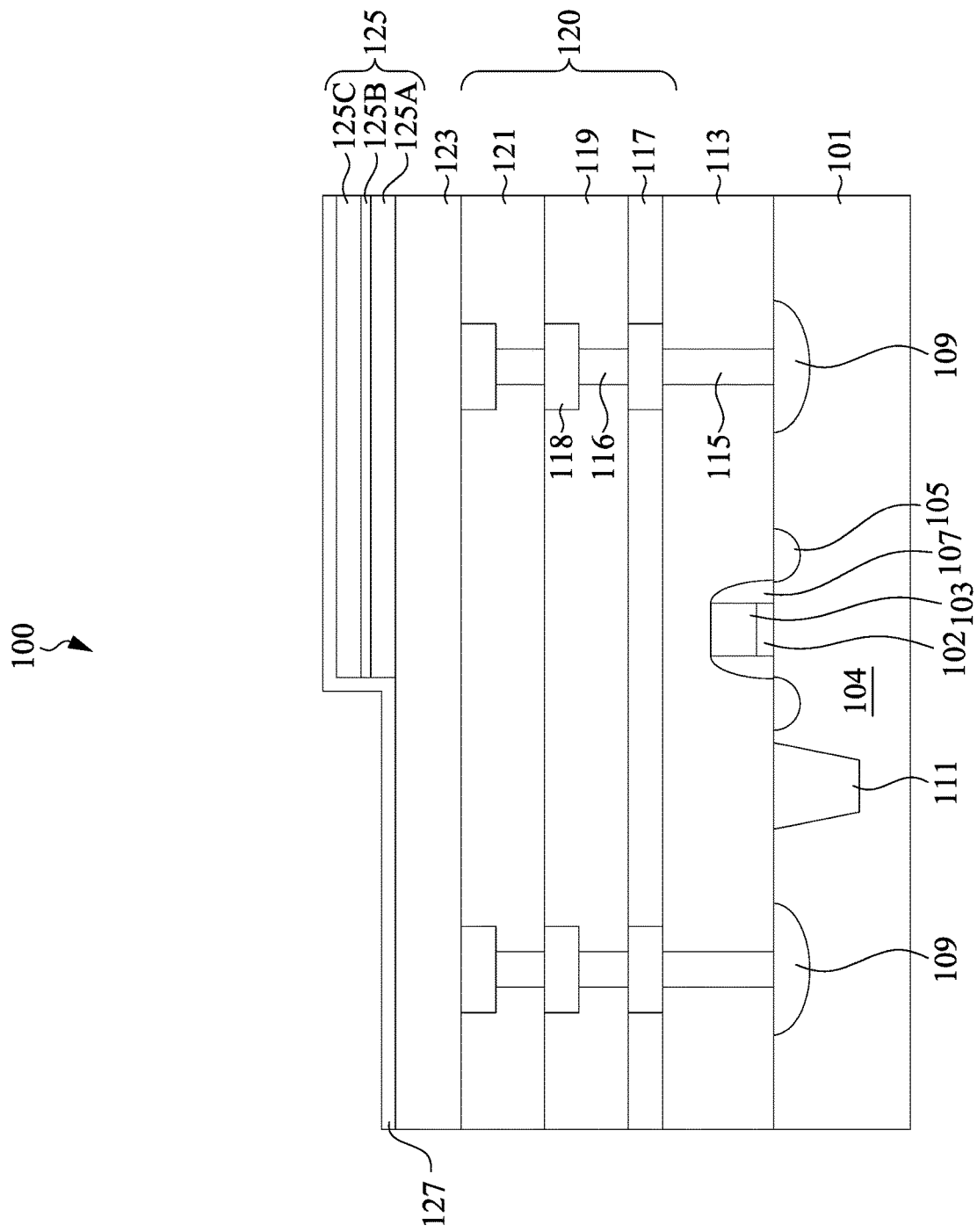

Next, in FIG. 6, a dielectric layer 127 is formed (e.g., conformally) over the bottom electrode 125. The dielectric layer 127 is formed of a high-k dielectric material, in an example embodiment. Example materials for the dielectric layer 127 include $HfO_2$, $ZrO_2$, $Al_2O_3$, $Ta_2O_5$, $TiO_2$, $La_2O_3$, $Y_2O_3$, $HfSiO_4$, $LaAlO_3$, $SrTiO_3$, $Si_3N_4$, combinations thereof, or the like. A suitable formation method, such as CVD, PECVD, ALD, or the like, may be used to form the dielectric layer 127. Note that the dielectric layer 127 has a stair shaped cross-section. A first portion (e.g., left portion in FIG. 6) of the dielectric layer 127 contacts and extends along the upper surface of the ESL 123, and a second portion (e.g., right portion in FIG. 6) of the dielectric layer 127 contacts and extends along the upper surface of the bottom electrode 125.

Figure 7:
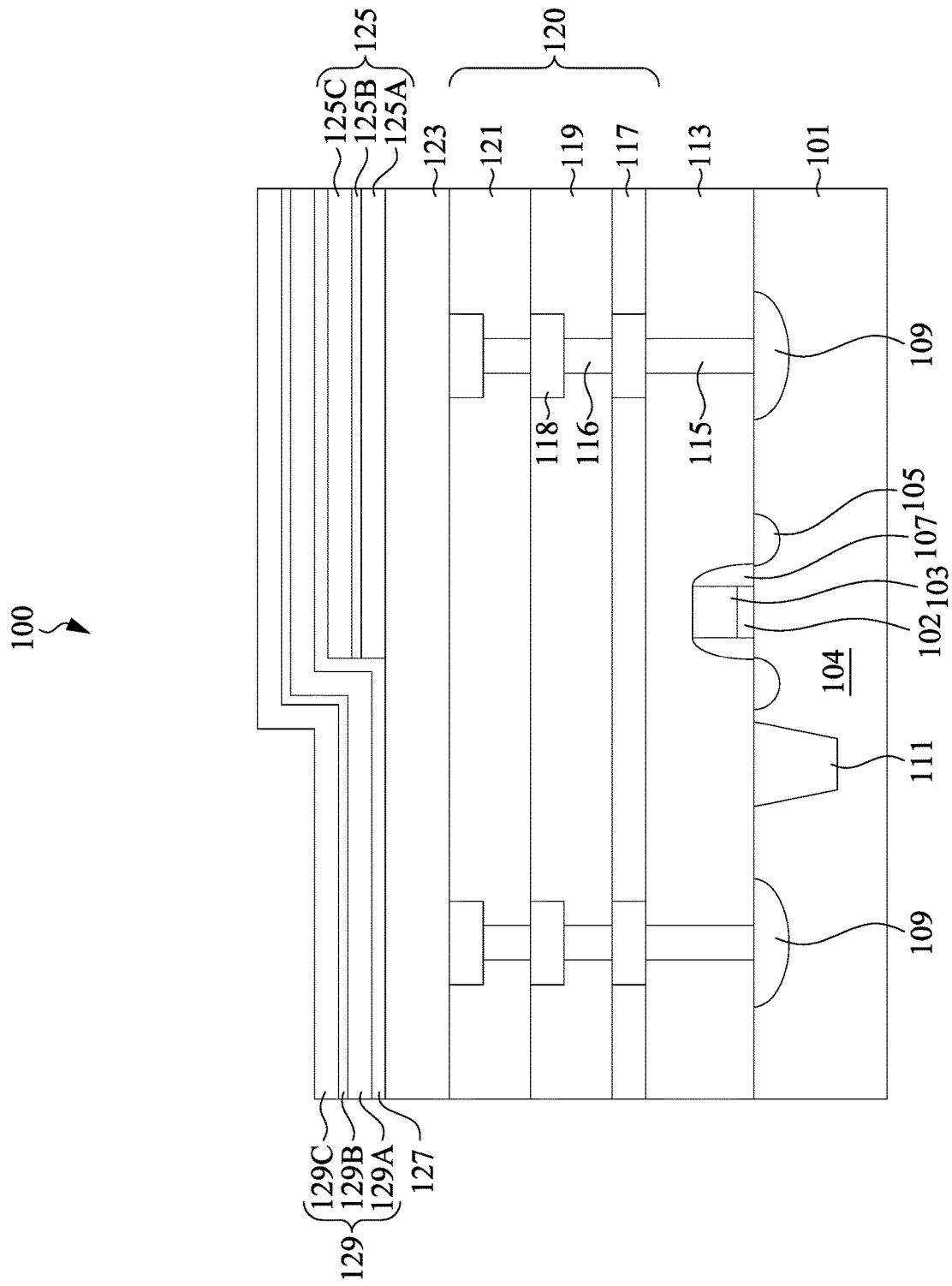

Next, in FIG. 7, conductive layers 129A, 129B, and 129C are formed successively over the dielectric layer 127 to form a tri-layered structure 129. In the illustrated embodiment, the tri-layered structure 129 is the same as the tri-layered structure 125 of FIG. 4. In other words, the conductive layers 129A, 129B, and 129C are the same as the conductive layers 125A, 125B, and 125C, respectively. The materials and the formation method of the tri-layered structure 129 is the same as or similar to that of the tri-layered structure 125, thus details are not repeated.

Figure 8:
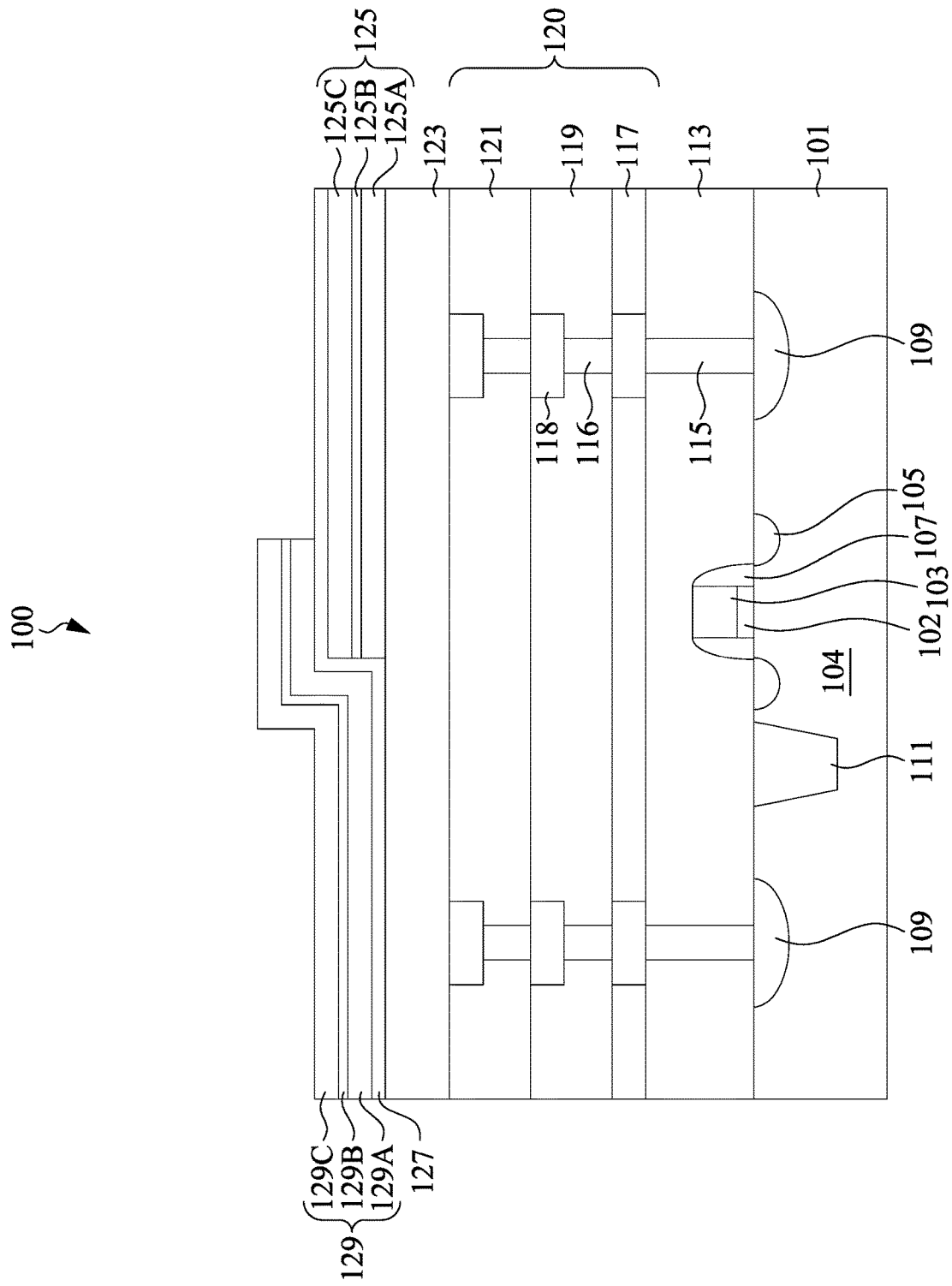

Next, in FIG. 8, the tri-layered structure 129 is patterned to form a middle electrode 129, using, e.g., photolithography and etching techniques. Details are the same as or similar to those discussed above for the bottom electrode 125, thus not repeated here. Note that the middle electrode 129 has a stair-shaped cross-section. A first portion (e.g., lower portion) of the middle electrode 129 is laterally adjacent to the bottom electrode 125, and a second portion (e.g., higher portion) is vertically above (e.g., over) the bottom electrode 125. In FIG. 8, the first portion of the dielectric layer 127 (which contacts and extends along the upper surface of the ESL 123) is covered (e.g., completely covered) by the middle electrode 129, and the second portion of the dielectric layer 127 (which contacts and extends along the upper surface of the bottom electrode 125) is partially exposed by the middle electrode 129.

Figure 9:
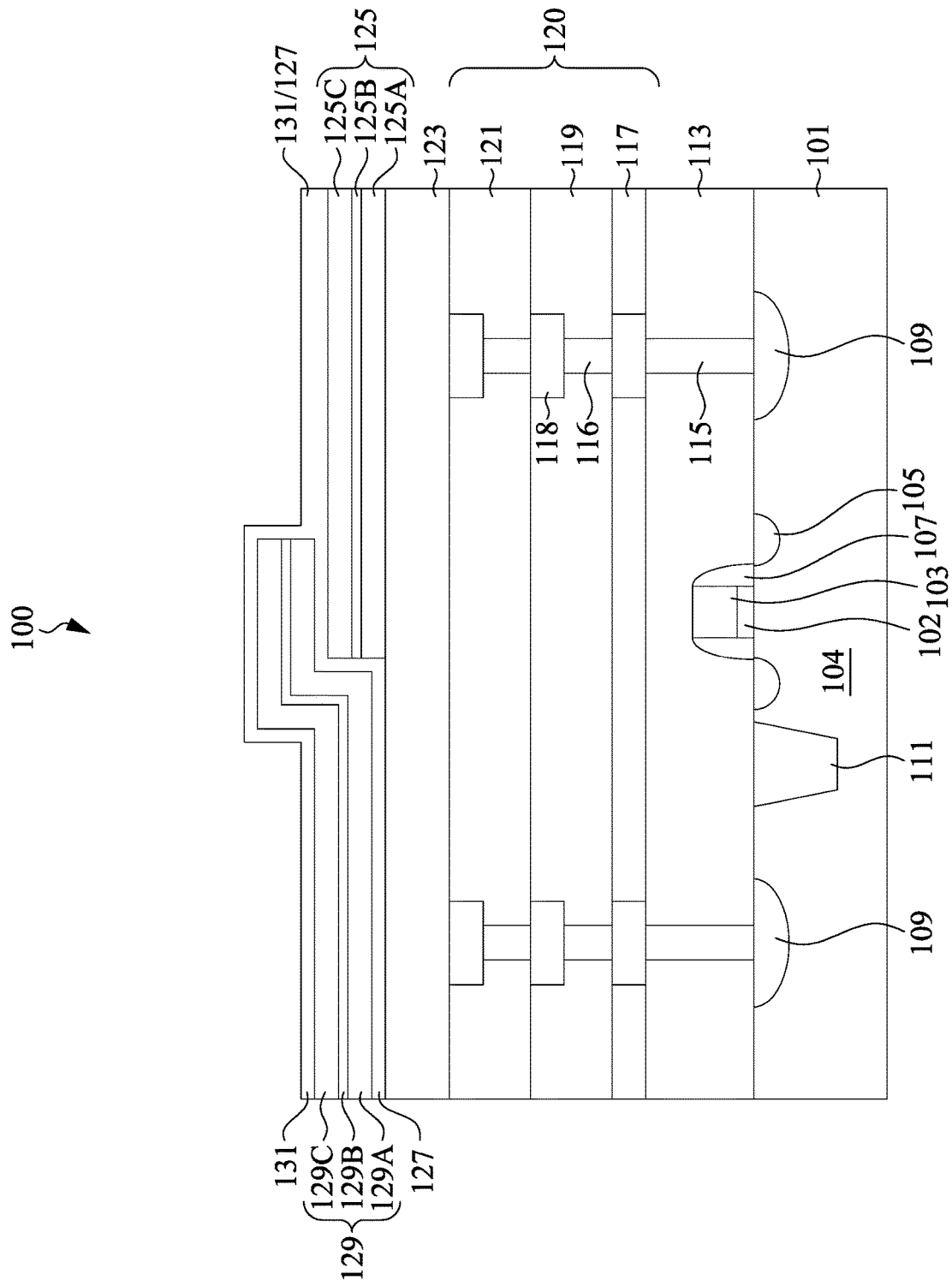

Next, in FIG. 9, a dielectric layer 131 (e.g., a high-k dielectric material) is formed (e.g., conformally) over the middle electrode 129 and over the exposed portion of the dielectric layer 127. In an example embodiment, the dielectric layer 131 is formed of the same material as the dielectric layer 127 using the same or similar formation method, thus details are not repeated. Note that a portion of the dielectric layer 131 contacts and extends along the upper surface and a sidewall of the middle electrode 129, and another portion of the dielectric layer 131 contacts and extends along the exposed portion of the dielectric layer 127. As a result, the exposed portion of the dielectric layer 127 merge with the overlying dielectric layer 131 to form a region of dielectric material (labeled as 131/127 in FIG. 9) that is about twice as thick as the dielectric layer 131 (or 127), in some embodiments.

Figure 10:
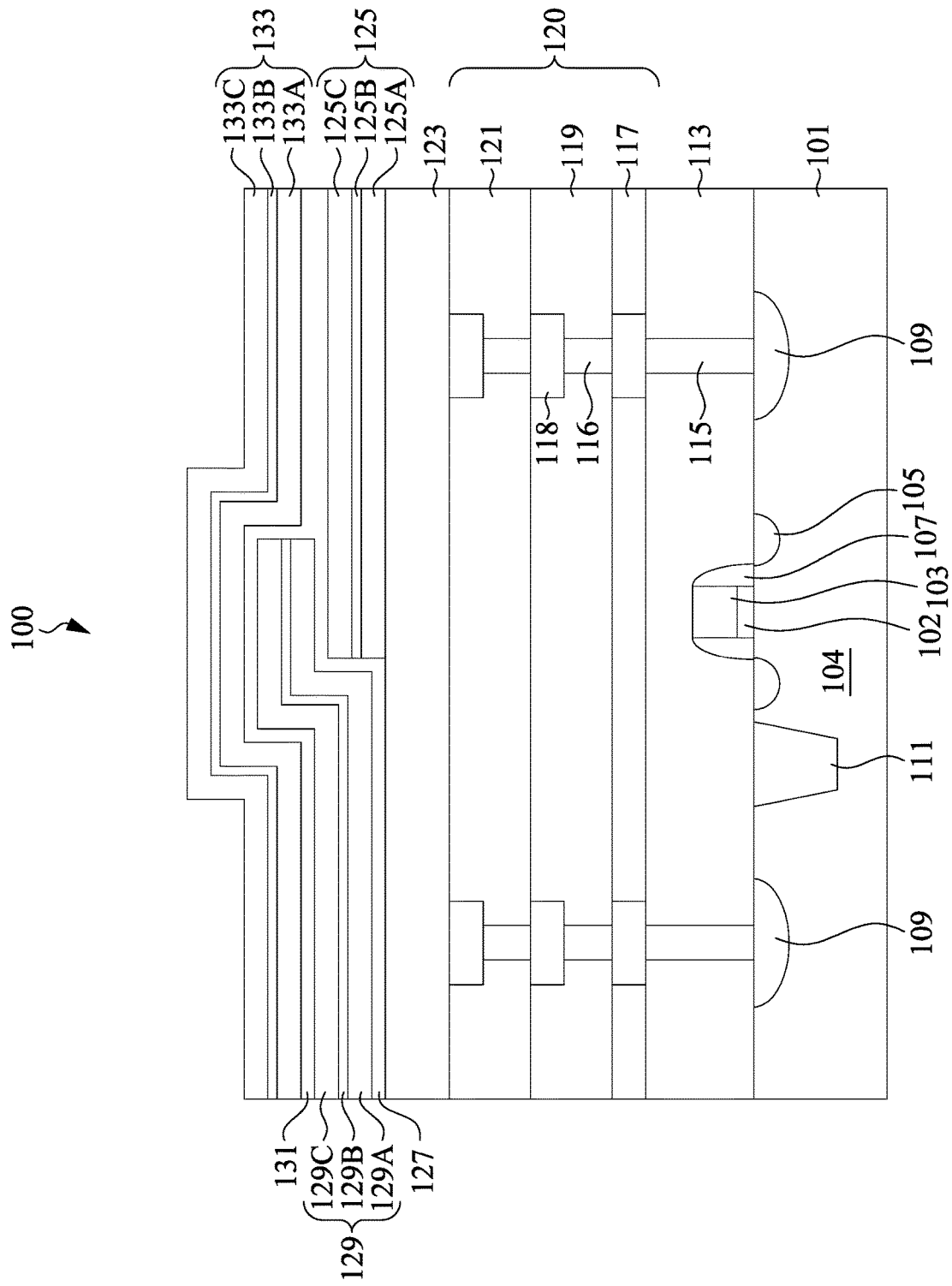

Next, in FIG. 10, conductive layers 133A, 133B, and 133C are formed successively over the dielectric layer 131 to form a tri-layered structure 133. In the illustrated embodiment, the tri-layered structure 133 is the same as the tri-layered structure 125 of FIG. 4. In other words, the conductive layers 133A, 133B, and 133C are the same as the conductive layers 125A, 125B, and 125C, respectively. The materials and the formation method of the tri-layered structure 133 is the same as or similar to that of the tri-layered structure 125, thus details are not repeated.

Figure 11:
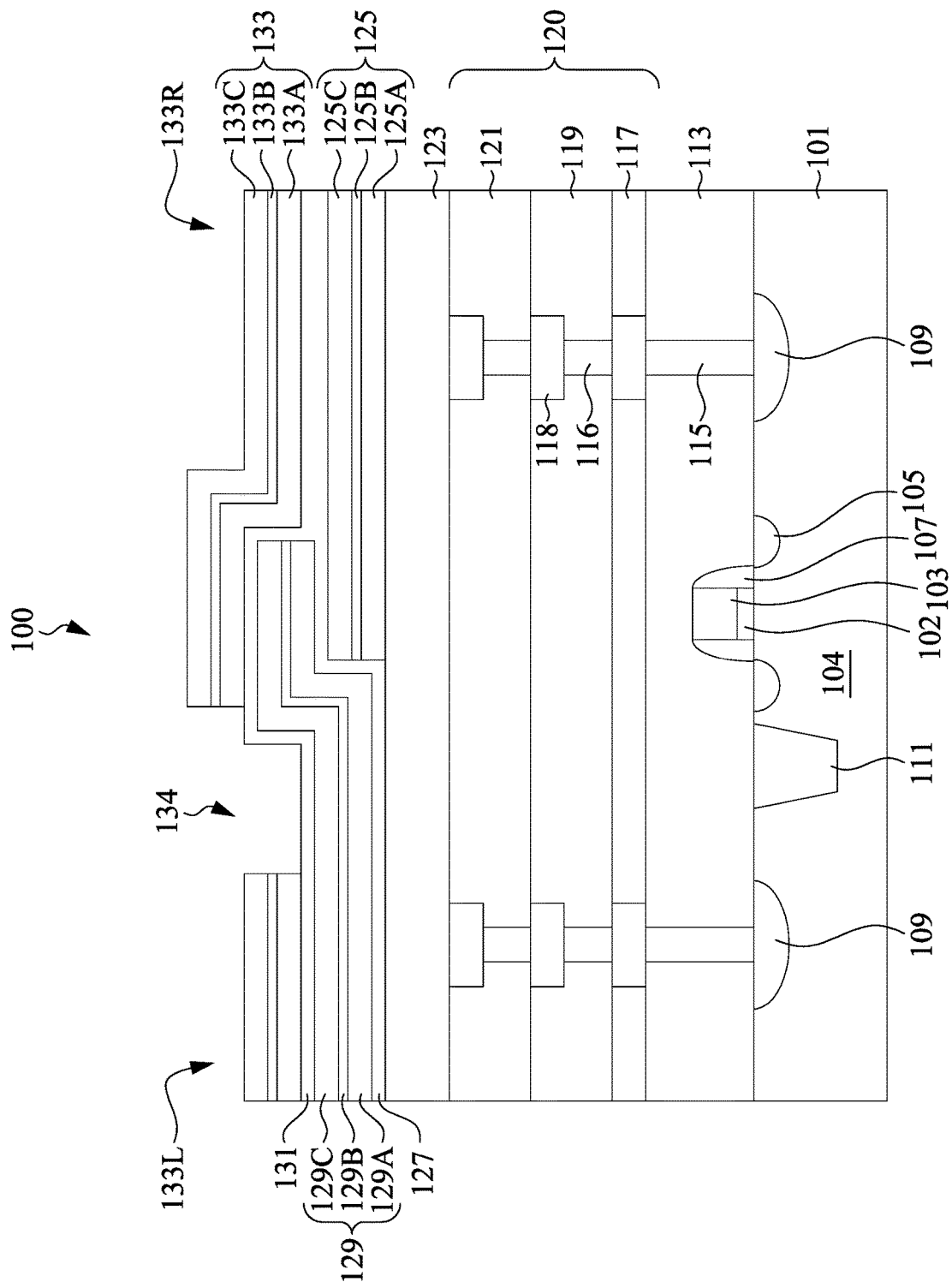

Next, in FIG. 11, the tri-layered structure 133 is patterned using, e.g., photolithography and etching techniques. In the illustrated embodiment, an opening 134 is formed in the tri-layered structure 133 to expose the dielectric layer 131, and the tri-layered structure 133 is separated into two separate portions, e.g. a left portion 133L and a right portion 133R. The right portion 133R has a stair-shaped cross-section and forms the top electrode 133R. In the example of FIG. 11, a first portion of the top electrode 133R is laterally adjacent to the middle electrode 129, and a second portion of the top electrode 133R is vertically above (e.g., over) the middle electrode 129. In the illustrated embodiment, a portion of the middle electrode 129 is vertically interposed between the bottom electrode 125 and a portion of the top electrode 133R. In other words, a portion of the top electrode 133R, a portion of the middle electrode 129, and a portion of the bottom electrode 125 are vertically stacked along a same vertical line. Note that the dielectric layers 127 and 131 separate the bottom electrode 125, the middle electrode 129, and the top electrode 133R from each other. As will be discussed in more details below, the bottom electrode 125, the middle electrode 129, and the dielectric layer 127 in-between form a first MIM capacitor. The top electrode 133R, the middle electrode 129, and the dielectric layer 131 in-between form a second MIM capacitor coupled in parallel to the first MIM capacitor.

Note that in FIG. 11, the left portion 133L of the tri-layered structure 133 is not used to form the second MIM capacitor, and therefore, may also be referred to as a dummy top electrode 133L. In the illustrated embodiment, the left portion 133L helps to ensure that during a subsequently etching process to form via openings (see 136A and 136B in FIG. 13), the via openings have substantially the same depth. Without the left portion 133L, the opening 136A in FIG. 13 may be formed deeper than the opening 136B, due to the different numbers of tri-layered structures the etching has to etch through.

Figure 12:
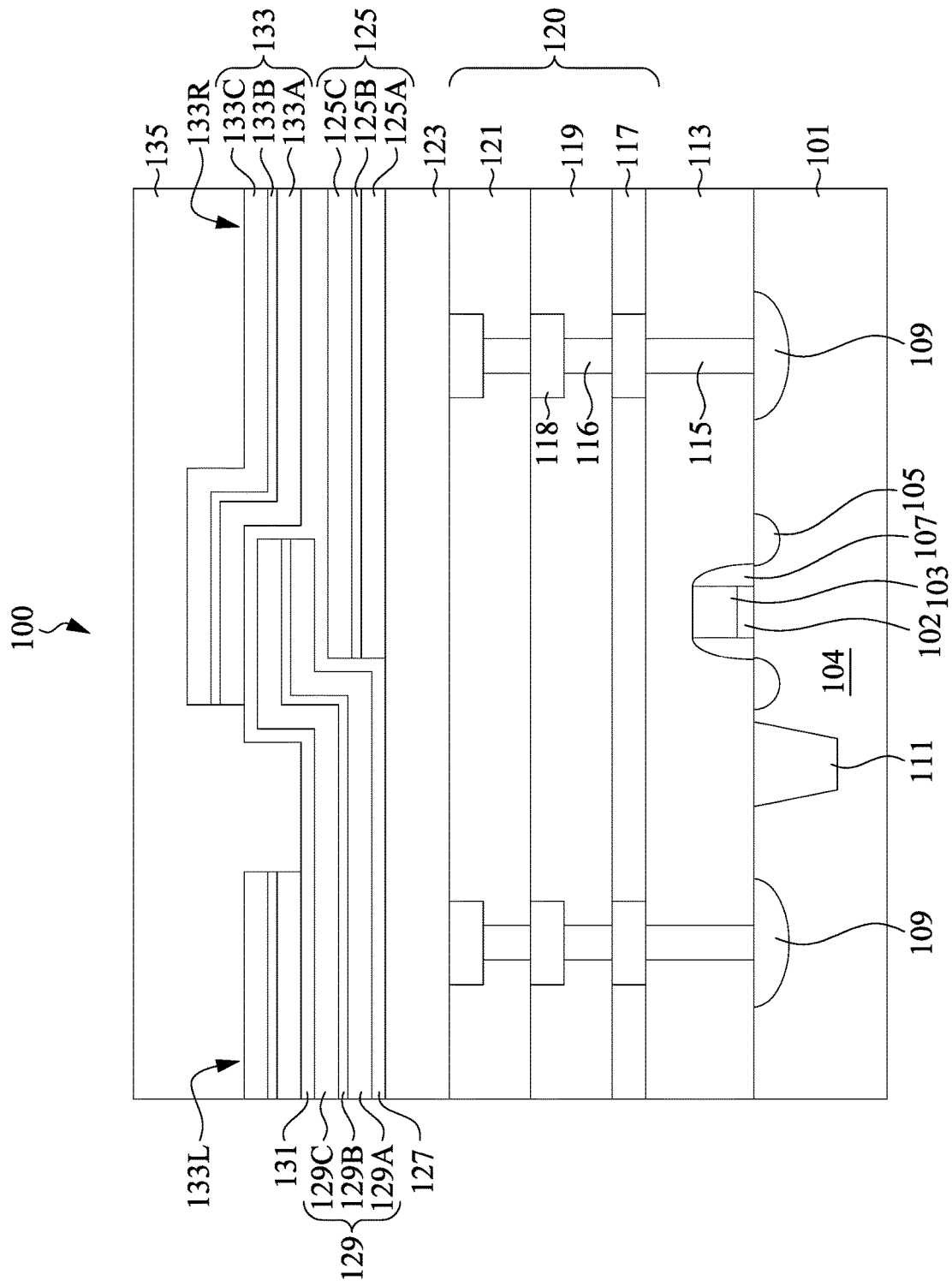

Next, in FIG. 12, a passivation layer 135 is formed over the top electrode 133R. The passivation layer 135 is formed of a suitable dielectric material, such as silicon oxide, a polymer (e.g., polyimide), or the like, using a suitable formation method such as CVD, PECVD, or the like. The passivation layer 135 fills the opening 134 (see FIG. 11). After the passivation layer 135 is formed, a planarization process, such as CMP, may be performed to achieve a level upper surface for the passivation layer 135.

Figure 13:
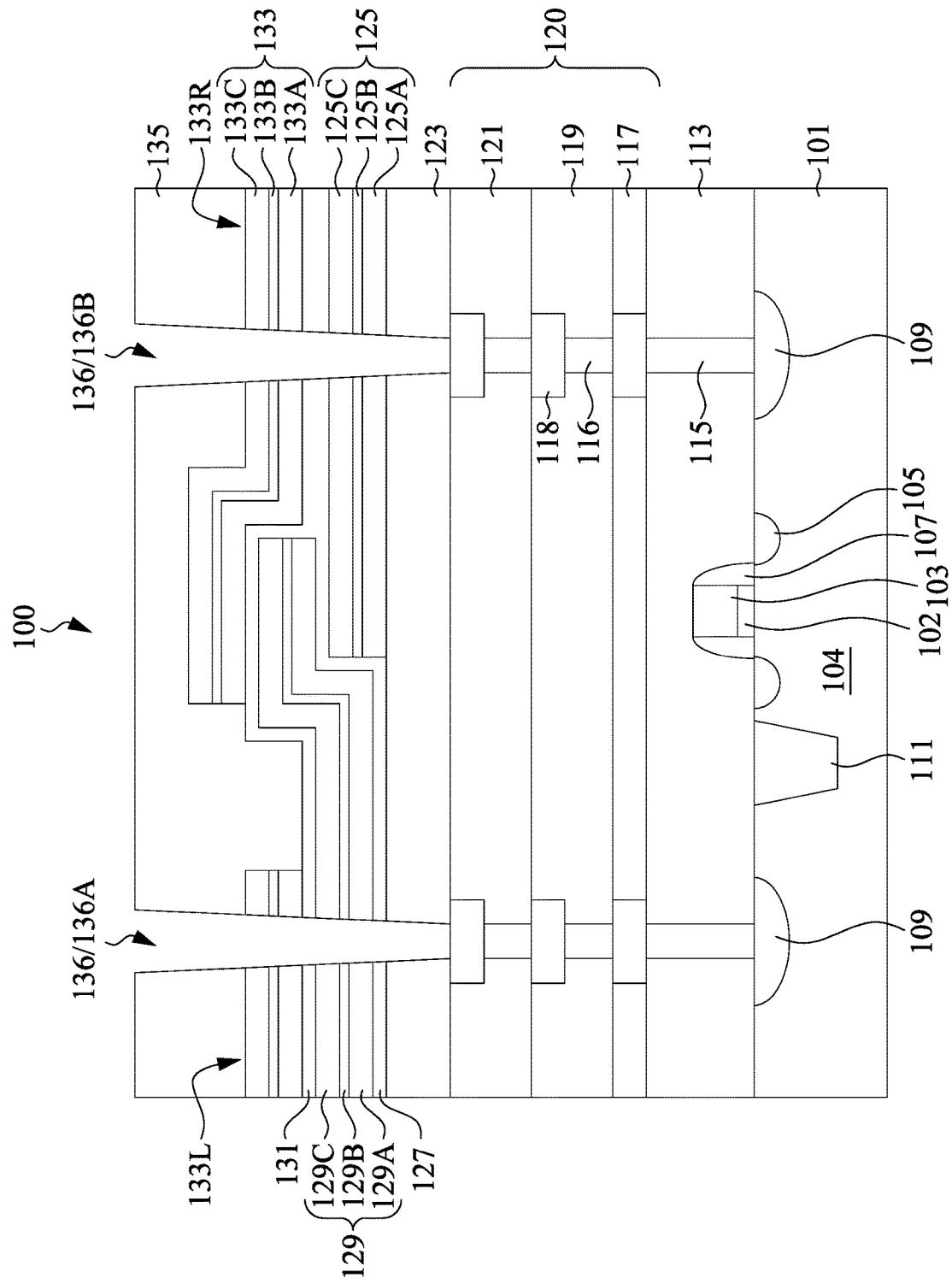

Next, in FIG. 13, openings 136 (e.g., 136A and 136B) are formed to expose the conductive features of the interconnect structure 120. The openings 136 are formed using photolithography and etching techniques, in an embodiment. In the example of FIG. 13, the opening 136A is formed to extends through the passivation layer 135, the left portion 133L of the tri-layered structure 133, the dielectric layer 131, the middle electrode 129, the dielectric layer 127, and the ESL 123. The opening 136B is formed to extends through the passivation layer 135, the top electrode 133R, the dielectric layer 131, the dielectric layer 127, the bottom electrode 125, and the ESL 123.

Figure 14:
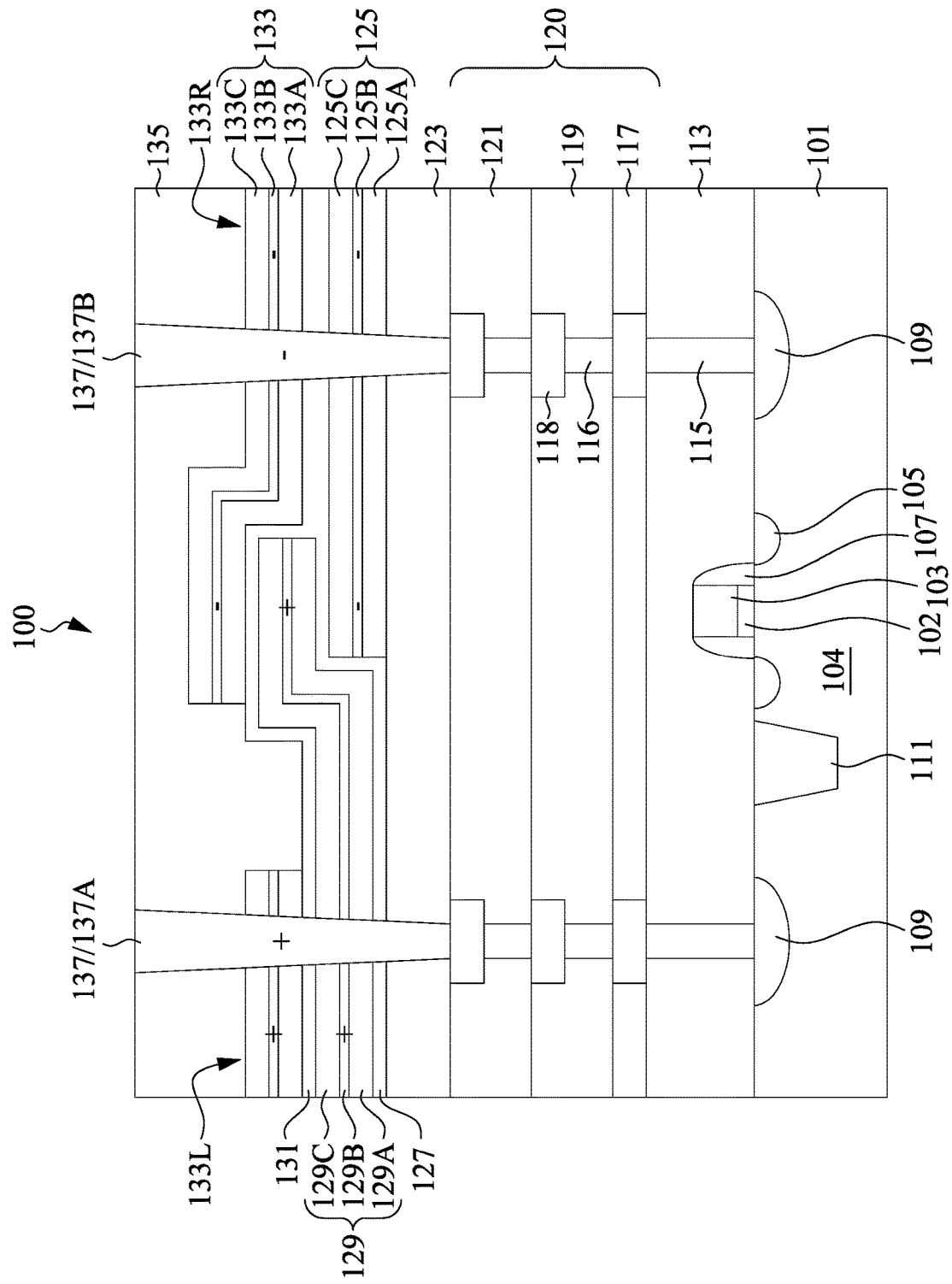

Next, in FIG. 14, one or more conductive materials are formed in the openings 136 to form vias 137 (e.g., 137A and 137B). The vias 137 may be formed by forming a barrier layer to line the sidewalls and bottoms of the openings 136, then fill the openings with a conductive material. Details are the same as or similar to those described above for the formation of the contact plugs 115, thus not repeated here. Note that in FIG. 14, sidewalls of the via 137A contact, thus are electrically coupled to, the left portion 133L of the tri-layer structure 133 and the middle electrode 129. Similarly, sidewalls of the via 137B contact, thus are electrically coupled to, the top electrode 133R and the bottom electrode 125.

FIG. 14 further illustrates an example electrical connection for the MIM capacitors of the semiconductor device 100. For example, the via 137A is connected to a first voltage supply node (e.g., a positive terminal of a voltage supply), and the via 137B is connected to a second voltage supply node (e.g., a negative terminal of a voltage supply). To facilitate discussion, "+" symbol or "−" symbol is shown on the top electrode 133R, the middle electrode 129, and the bottom electrode 125 to illustrate their electrical connections to the voltage supply. Skilled artisan will readily appreciate that other electrical connections are possible. For example, the "+" symbols and the "−" symbols in FIG. 14 may be switched. Therefore, in the example of FIG. 14, the two MIM capacitors are coupled in parallel between the positive terminal labeled by "+" and the negative terminal labeled by "−", as illustrated in FIG. 15.

Figure 15:
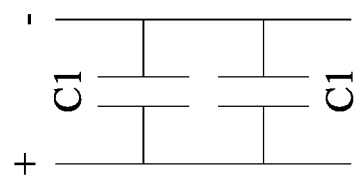
FIG. 15 illustrates a schematic view of capacitors coupled in parallel, in an embodiment.

FIG. 15 illustrates a schematic view of the MIM capacitors in FIG. 14, in an embodiment. As illustrated in FIG. 15, a first capacitor C1 and a second capacitor C2 are coupled in parallel between the positive terminal and the negative terminal. The first capacitor C1 may correspond to the MIM capacitor formed by the bottom electrode 125, the middle electrode 129, and the dielectric layer 127 in-between. The second capacitor C2 may correspond to the MIM capacitor formed by the top electrode 133R, the middle electrode 129, and the dielectric layer 131 in-between. The parallel connection of the first capacitors C1 and the second capacitor C2 results in an equivalent capacitor with a larger capacitance, which larger capacitance is the sum of the capacitances of the first capacitor C1 and the second capacitor C2.

Figure 16:
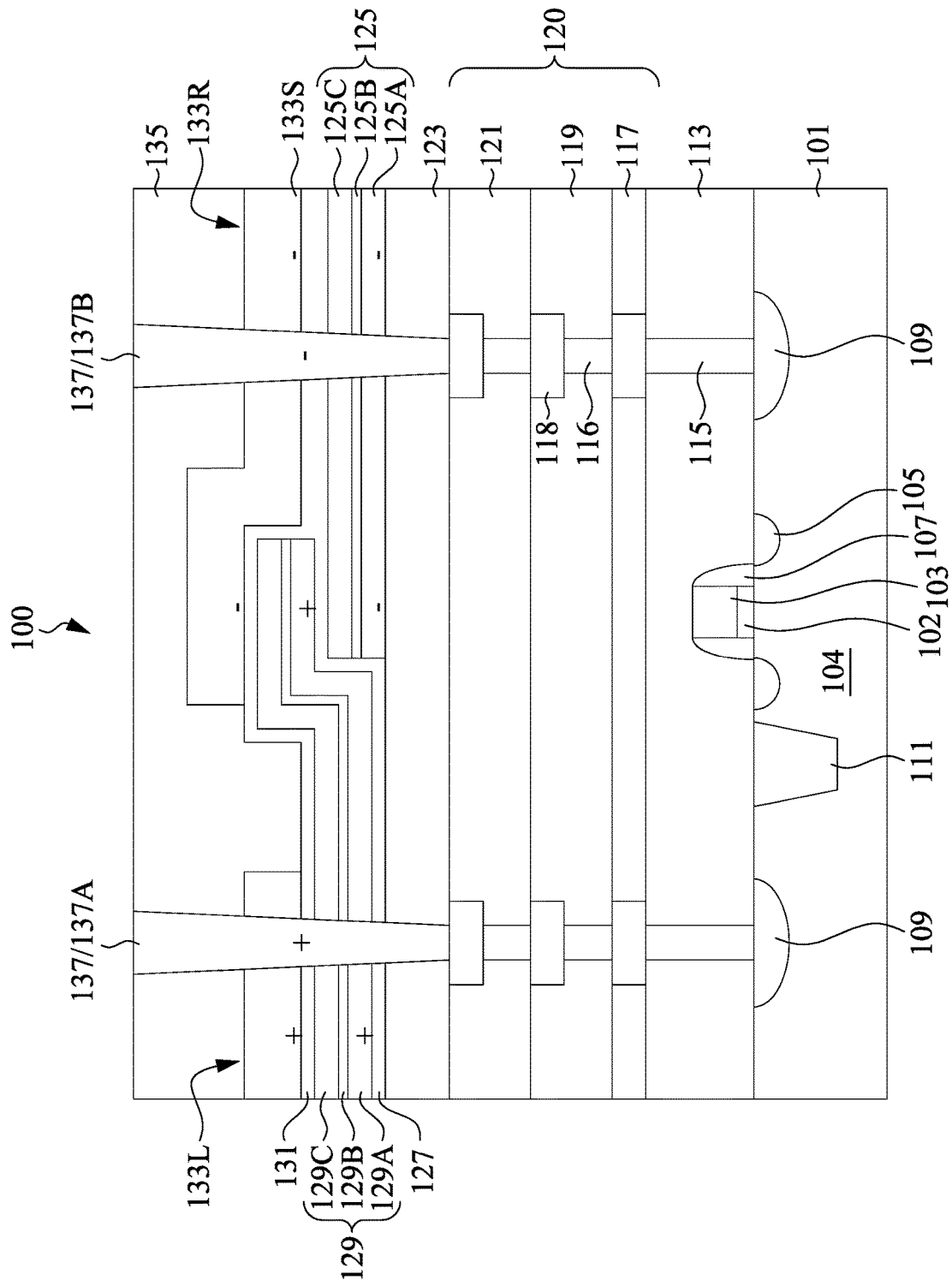
FIG. 16 illustrates a cross-sectional view of a semiconductor device, in another embodiment.

FIG. 16 illustrates a cross-sectional view of a semiconductor device 100A, in another embodiment. The semiconductor device 100A is similar to the semiconductor device 100 of FIG. 14, but the tri-layered structure 133 in FIG. 14 is replaced by a single conductive layer 133S in FIG. 16. In some embodiments, the single conductive layer 133S in FIG. 16 is formed of the same material as the conductive layer 133A (or 133C) in FIG. 14, and has a same thickness as the tri-layered structure 133 in FIG. 14. In other words, to form the single conductive layer 133S in FIG. 16, the conductive layer 133B in the tri-layered structure 133 of FIG. 14 is no longer formed, and the material (e.g., TiN) of the conductive layer 133A is grown (e.g., deposited) to the full thickness of the tri-layered structure 133 in FIG. 14. This simplifies the manufacturing process and reduces cost. Note that unlike the tri-layered structures 125 and 129, which has a high-k dielectric material (e.g., 127 or 131) formed thereon, no high-k dielectric material is formed over the single conductive layer 133S to form MIM capacitor. Therefore, although the single conductive layer 133S has a higher surface roughness than the tri-layered structures 125 and 129, there is no performance loss (e.g., VBD and/or TDDB) caused by the higher surface roughness of the single conductive layer 133S.

Embodiments may achieve advantages. By using the tri-layered structure instead of a single layer structure for the electrodes of the MIM capacitors, the surface roughness of the electrodes is reduced. The reduced surface roughness alleviates or avoids performance degradation in terms of VBD and TDDB. As a result, the performance and reliability of the semiconductor device formed are improved.

Figure 17:
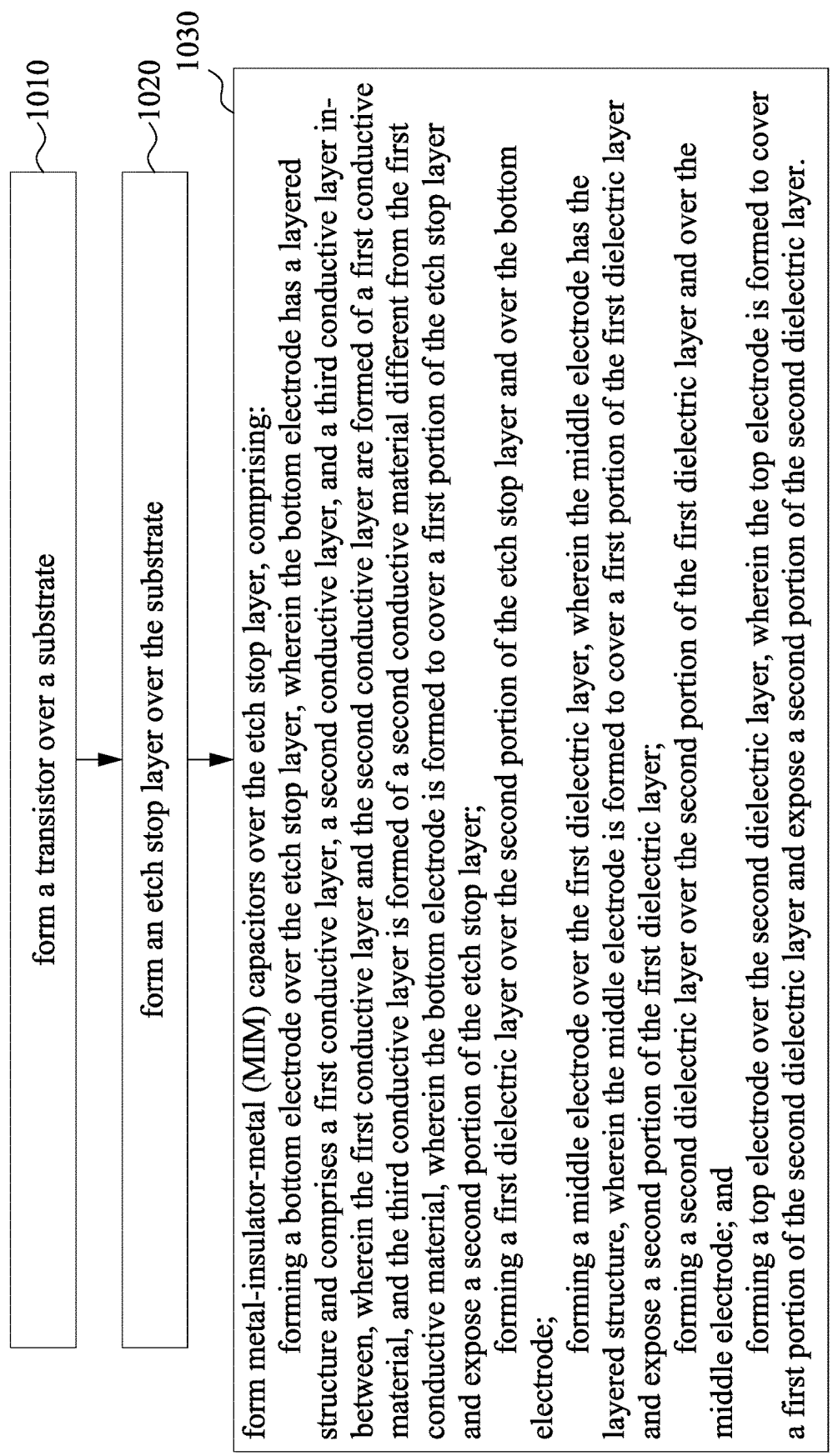
FIG. 17 is a flow chart of a method of forming a semiconductor device, in some embodiments.

FIG. 17 illustrates a flow chart of a method 1000 of fabricating a semiconductor device, in accordance with some embodiments. It should be understood that the embodiment method shown in FIG. 17 is merely an example of many possible embodiment methods. One of ordinary skill in the art would recognize many variations, alternatives, and modifications. For example, various steps as illustrated in FIG. 17 may be added, removed, replaced, rearranged, or repeated.

Referring to FIG. 17, at block 1010, a transistor is formed over a substrate. At block 1020, an etch stop layer is formed over the substrate. At block 1030, metal-insulator-metal (MIM) capacitors are over the etch stop layer, comprising: forming a bottom electrode over the etch stop layer, wherein the bottom electrode has a layered structure and comprises a first conductive layer, a second conductive layer, and a third conductive layer in-between, wherein the first conductive layer and the second conductive layer are formed of a first conductive material, and the third conductive layer is formed of a second conductive material different from the first conductive material, wherein the bottom electrode is formed to cover a first portion of the etch stop layer and expose a second portion of the etch stop layer; forming a first dielectric layer over the second portion of the etch stop layer and over the bottom electrode; forming a middle electrode over the first dielectric layer, wherein the middle electrode has the layered structure, wherein the middle electrode is formed to cover a first portion of the first dielectric layer and expose a second portion of the first dielectric layer; forming a second dielectric layer over the second portion of the first dielectric layer and over the middle electrode; and forming a top electrode over the second dielectric layer, wherein the top electrode is formed to cover a first portion of the second dielectric layer and expose a second portion of the second dielectric layer.

In an embodiment, a semiconductor device includes: a substrate; an interconnect structure over the substrate; an etch stop layer over the interconnect structure; and metal-insulator-metal (MIM) capacitors over the etch stop layer, comprising: a bottom electrode extending along the etch stop layer, wherein the bottom electrode has a layered structure that comprises a first conductive layer, a second conductive layer, and a third conductive layer between the first conductive layer and the second conductive layer, wherein the first conductive layer and the second conductive layer comprise a first material, and the third conductive layer comprises a second material different from the first material; a first dielectric layer over the bottom electrode; a middle electrode over the first dielectric layer, wherein the middle electrode has the layered structure; a second dielectric layer over the middle electrode; and a top electrode over the second dielectric layer. In an embodiment, the top electrode has the layered structure. In an embodiment, the middle electrode has a stair shaped cross-section. In an embodiment, the first dielectric layer has a first portion contacting and extending along the etch stop layer, and has a second portion contacting and extending along an upper surface of the bottom electrode distal from the substrate. In an embodiment, the middle electrode has a first portion laterally adjacent to the bottom electrode, and has a second portion vertically above the bottom electrode. In an embodiment, a lower surface of the first portion of the middle electrode facing the substrate is further from the substrate than a lower surface of the bottom electrode facing the substrate. In an embodiment, the second dielectric layer has a first portion contacting and extending along an upper surface of the middle electrode distal from the substrate, and has a second portion contacting and extending along the first dielectric layer. In an embodiment, the semiconductor device further includes a third dielectric layer over the top electrode, wherein the third dielectric layer contacts the first portion of the second dielectric layer, wherein the second portion of the second dielectric layer is separated from the third dielectric layer by the top electrode. In an embodiment, the top electrode has a first portion laterally adjacent to the second portion of the middle electrode, and has a second portion vertically above the second portion of the middle electrode. In an embodiment, the semiconductor device further includes: a first via extending through the middle electrode, wherein sidewalls of the first via contact the middle electrode; and a second via extending through the top electrode and the bottom electrode, wherein sidewalls of the second via contact the top electrode and the bottom electrode. In an embodiment, wherein the first material is an electrically conductive material having a columnar polycrystalline structure.

In an embodiment, a semiconductor device includes: a substrate having a transistor; an etch stop layer over the substrate; and metal-insulator-metal (MIM) capacitors over the etch stop layer, comprising: a bottom electrode over the etch stop layer, wherein the bottom electrode covers a first portion of the etch stop layer and exposes a second portion of the etch stop layer, wherein the bottom electrode has a layered structure comprising: a first layer of a first conductive material; a second layer of the first conductive material; and a third layer of a second conductive material different from the first conductive material, wherein the third layer is between the first layer and the second layer; a first dielectric layer over the bottom electrode and the second portion of the etch stop layer; a middle electrode over the first dielectric layer, wherein the middle electrode has the same layered structure as the bottom electrode; a second dielectric layer over the middle electrode and the first dielectric layer; and a top electrode over the second dielectric layer. In an embodiment, the middle electrode covers a first portion of the first dielectric layer and exposes a second portion of the first dielectric layer. In an embodiment, the top electrode covers a first portion of the second dielectric layer and exposes a second portion of the second dielectric layer. In an embodiment, the middle electrode is interposed between a first portion of the first dielectric layer and a first portion of the second dielectric layer, wherein a second portion of the first dielectric layer contacts and extends along a second portion of the second dielectric layer. In an embodiment, the bottom electrode and the top electrode are configured to be electrically coupled to a first voltage supply node, and the middle electrode is configured to be electrically coupled to a second voltage supply node.

In an embodiment, a method of forming a semiconductor device includes: forming a transistor over a substrate; forming an etch stop layer over the substrate; and forming metal-insulator-metal (MIM) capacitors over the etch stop layer, comprising: forming a bottom electrode over the etch stop layer, wherein the bottom electrode has a layered structure and comprises a first conductive layer, a second conductive layer, and a third conductive layer in-between, wherein the first conductive layer and the second conductive layer are formed of a first conductive material, and the third conductive layer is formed of a second conductive material different from the first conductive material, wherein the bottom electrode is formed to cover a first portion of the etch stop layer and expose a second portion of the etch stop layer; forming a first dielectric layer over the second portion of the etch stop layer and over the bottom electrode; forming a middle electrode over the first dielectric layer, wherein the middle electrode has the layered structure, wherein the middle electrode is formed to cover a first portion of the first dielectric layer and expose a second portion of the first dielectric layer; forming a second dielectric layer over the second portion of the first dielectric layer and over the middle electrode; and forming a top electrode over the second dielectric layer, wherein the top electrode is formed to cover a first portion of the second dielectric layer and expose a second portion of the second dielectric layer. In an embodiment, the first conductive material has a columnar polycrystalline structure. In an embodiment, the middle electrode is formed to have a first stair shaped cross-section, and the top electrode is formed to have a second stair shaped cross-section. In an embodiment, the method further includes: forming a first via that extends through the first dielectric layer, the second dielectric layer, and the middle electrode; and forming a second via that extends through the first dielectric layer, the second dielectric layer, the bottom electrode, and the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
an interconnect structure over the substrate;
an etch stop layer over the interconnect structure; and
metal-insulator-metal (MIM) capacitors over the etch stop layer, comprising:
a bottom electrode extending along the etch stop layer, wherein the bottom electrode has a layered structure that comprises a first conductive layer, a second conductive layer, and a third conductive layer between the first conductive layer and the second conductive layer, wherein the first conductive layer and the second conductive layer comprise a first material, and the third conductive layer comprises a second material different from the first material, wherein the second material is a metal material, and the first material is a nitride of the metal material, wherein the third conductive layer has a lower surface roughness than the first conductive layer and the second conductive layer;
a first dielectric layer over the bottom electrode;
a middle electrode over the first dielectric layer, wherein the middle electrode has the layered structure;
a second dielectric layer over the middle electrode; and
a top electrode over the second dielectric layer.

2. The semiconductor device of claim 1, wherein the top electrode has the layered structure.

3. The semiconductor device of claim 1, wherein the first material is an electrically conductive material having a columnar polycrystalline structure, wherein the second material is an electrically conductive material having a flat grain structure.

4. The semiconductor device of claim 1, wherein each of the first conductive layer, the second conductive layer, and the third conductive layer is a single layer of a respective material.

5. The semiconductor device of claim 1, wherein the first dielectric layer has a first portion contacting and extending along the etch stop layer, and has a second portion contacting and extending along an upper surface of the bottom electrode distal from the substrate, wherein the middle electrode has a first portion laterally adjacent to the bottom electrode, and has a second portion vertically above the bottom electrode, wherein a lower surface of the first portion of the middle electrode facing the substrate is further from the substrate than a lower surface of the bottom electrode facing the substrate, wherein the second dielectric layer has a first portion contacting and extending along an upper surface of the middle electrode distal from the substrate, and has a second portion contacting and extending along the first dielectric layer.

6. The semiconductor device of claim 5, further comprising a third dielectric layer over the top electrode, wherein the third dielectric layer contacts the first portion of the second dielectric layer, wherein the second portion of the second dielectric layer is separated from the third dielectric layer by the top electrode.

7. The semiconductor device of claim 1, wherein the middle electrode has a first portion laterally adjacent to the bottom electrode, and has a second portion vertically above the bottom electrode, wherein the top electrode has a first portion laterally adjacent to the second portion of the middle electrode, and has a second portion vertically above the second portion of the middle electrode, wherein the semiconductor device further comprises:
a first via extending through the middle electrode, wherein sidewalls of the first via contact the middle electrode; and
a second via extending through the top electrode and the bottom electrode, wherein sidewalls of the second via contact the top electrode and the bottom electrode.

8. The semiconductor device of claim 7, further comprising a dummy top electrode over the second dielectric layer and laterally adjacent to the second portion of the middle electrode, wherein the first via extends through the dummy top electrode.

9. A semiconductor device comprising:
a substrate having a transistor;
an etch stop layer over the substrate; and metal-insulator-metal (MIM) capacitors over the etch stop layer, comprising:
- a bottom electrode over the etch stop layer, wherein the bottom electrode covers a first portion of the etch stop layer and exposes a second portion of the etch stop layer, wherein the bottom electrode has a tri-layered structure comprising:
  - a first layer of a first conductive material;
  - a second layer of the first conductive material; and
  - a third layer of a second conductive material different from the first conductive material, wherein the second conductive material is a metal material, and the first conductive material is a compound of the metal material, wherein the third layer is between the first layer and the second layer, wherein a surface roughness of the third layer is lower than that of the first layer and lower than that of the second layer;
- a first dielectric layer over the bottom electrode and the second portion of the etch stop layer;
- a middle electrode over the first dielectric layer, wherein the middle electrode has the same layered structure as the bottom electrode;
- a second dielectric layer over the middle electrode and the first dielectric layer; and
- a top electrode over the second dielectric layer.

10. The semiconductor device of claim 9, wherein the middle electrode is interposed between a first portion of the first dielectric layer and a first portion of the second dielectric layer, wherein a second portion of the first dielectric layer contacts and extends along a second portion of the second dielectric layer.

11. The semiconductor device of claim 9, wherein the bottom electrode and the top electrode are configured to be electrically coupled to a first voltage supply node, and the middle electrode is configured to be electrically coupled to a second voltage supply node.

12. The semiconductor device of claim 9, wherein the middle electrode covers a first portion of the first dielectric layer and exposes a second portion of the first dielectric layer.

13. The semiconductor device of claim 12, wherein the top electrode covers a first portion of the second dielectric layer and exposes a second portion of the second dielectric layer.

14. The semiconductor device of claim 9, further comprising a dummy top electrode over the second dielectric layer and laterally adjacent to the top electrode, wherein the dummy top electrode and the top electrode comprise a same conductive material, wherein the semiconductor device further comprises:
- a first via that extends through the dummy top electrode and the middle electrode; and
- a second via that extends through the top electrode and the bottom electrode.

15. The semiconductor device of claim 14, wherein the first via contacts the dummy top electrode and the middle electrode, wherein the second via contacts the top electrode and the bottom electrode.

16. The semiconductor device of claim 14, further comprising a third dielectric layer over the top electrode, wherein the dummy top electrode is separated from the top electrode by the third dielectric layer.

17. A method of forming a semiconductor device, the method comprising:
- forming a transistor over a substrate;
- forming an etch stop layer over the substrate; and
- forming metal-insulator-metal (MIM) capacitors over the etch stop layer, comprising:
  - forming a bottom electrode over the etch stop layer, wherein the bottom electrode has a layered structure and comprises a first conductive layer, a second conductive layer, and a third conductive layer in-between, wherein the first conductive layer and the second conductive layer are formed of a first conductive material, and the third conductive layer is formed of a second conductive material different from the first conductive material, wherein the second conductive material is a metal material, and the first conductive material is a compound of the metal material, wherein the bottom electrode is formed to cover a first portion of the etch stop layer and expose a second portion of the etch stop layer;
  - forming a first dielectric layer over the second portion of the etch stop layer and over the bottom electrode;
  - forming a middle electrode over the first dielectric layer, wherein the middle electrode has the layered structure, wherein the middle electrode is formed to cover a first portion of the first dielectric layer and expose a second portion of the first dielectric layer;
  - forming a second dielectric layer over the second portion of the first dielectric layer and over the middle electrode; and
  - forming a top electrode over the second dielectric layer, wherein the top electrode is formed to cover a first portion of the second dielectric layer and expose a second portion of the second dielectric layer.

18. The method of claim 17, wherein the first conductive material has a columnar polycrystalline structure, wherein the second conductive material has a flat grain structure.

19. The method of claim 17, further comprising forming a dummy top electrode over the second dielectric layer, wherein the dummy top electrode and the top electrode are formed of a same material, wherein the dummy top electrode is spaced apart from the top electrode.

20. The method of claim 19, further comprising:
- forming a first via that extends through the top dummy electrode, the second dielectric layer, the middle electrode, and the first dielectric layer; and
- forming a second via that extends through the top electrode, the second dielectric layer, the first dielectric layer, and the bottom electrode.

* * * * *